US006532215B1

(12) United States Patent
Muntz

(10) Patent No.: US 6,532,215 B1
(45) Date of Patent: Mar. 11, 2003

(54) DEVICE AND METHOD FOR NETWORK COMMUNICATIONS AND DIAGNOSTICS

(75) Inventor: Gary S. Muntz, Lexington, MA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/130,915

(22) Filed: Aug. 7, 1998

(51) Int. Cl.[7] .............................................. G01R 31/08

(52) U.S. Cl. ...................................... 370/242; 702/108

(58) Field of Search ................................ 370/249, 241, 370/242, 243, 244, 245, 246, 247, 248, 250, 251, 252, 253, 528, 468; 702/97, 108

(56) References Cited

U.S. PATENT DOCUMENTS

| | | | |
|---|---|---|---|
| 4,351,059 A | 9/1982 | Gregoire et al. ............... 375/10 |
| 4,385,384 A | 5/1983 | Rosbury et al. ............ 6371/22 |
| 4,438,511 A | 3/1984 | Baran | |
| 4,445,213 A | 4/1984 | Baugh et al. | |
| 4,490,817 A | 12/1984 | Turner ......................... 370/17 |
| 4,561,090 A | 12/1985 | Turner ......................... 370/60 |
| 4,578,796 A | 3/1986 | Charalambous et al. | |
| 4,620,294 A | 10/1986 | Leung et al. | |
| 4,653,070 A | 3/1987 | Nakajima et al. ............... 375/3 |
| 4,679,227 A | 7/1987 | Hughes-Hartogs | |
| 4,757,495 A | 7/1988 | Decker et al. | |
| 4,922,534 A | 5/1990 | Gorniak et al. ............... 380/49 |
| 4,980,897 A | 12/1990 | Decker et al. | |
| 4,991,169 A | 2/1991 | Davis et al. | |
| RE33,900 E | 4/1992 | Howson | |
| 5,206,886 A | 4/1993 | Bingham | |
| 5,353,338 A | 10/1994 | Nakano et al. ............... 379/99 |
| 5,394,442 A | 2/1995 | Lill | |
| 5,497,373 A | 3/1996 | Hulen et al. ................... 370/79 |
| 5,530,367 A | * 6/1996 | Bottman | |
| 5,553,063 A | 9/1996 | Dickson ....................... 370/29 |
| 5,586,054 A | * 12/1996 | Jensen et al. ............... 370/238 |
| 6,324,168 B1 | * 11/2001 | Richardson .................. 370/254 |

OTHER PUBLICATIONS

Analog Devices, Inc., "Analog Devices and ADSL," pp. 1–6, http://www.anolog.com . . . /pers/products/back_adsl/index/html.
Analog Devices, Inc., "Analog Devices Announces Low–Cost Chipset for High–Speed ADSL_Modems [AD20msp910]," pp. 1–2, http://www.analog.com/publications/press/products/ADSL 082696.html.
Efficient Networks, Inc., "Options for Customer Premises Equipment in ATM/ADSL Networks," pp. 1–8, http://www.efficient.com/whitepapers/cpe_dsl_wp3.html.
Tektronix, Inc., "Measurement: 1. What Will a TDR Do for Me?," pp. 1–3, http://www.tek.com/Mea . . . t/App_Notes/ts100–tdrmeas/tdr.html (and related graphics).
Tektronix, Inc., "Measurement: 2. Using the Tektronix TS100," pp. 1–2, httjp://www.tek.com/Mea . . . App_Notes/ts100–tdrmeas/ts100.html (and related graphics).
Tektronix, Inc., "Measurement: 3. Locating Load Coils with the Tektronix TS100," pp. 1–2, http://www.tek.com/Mea . . . _Notes/ts100–tdrmeas/loadcoil.html (and related graphics).
Tektronix, Inc., "Measurement: 4. Locating Split Pairs with the Tektronix TS100," pp. 1–2, http://www.tek.com/Me . . . Notes/ts100–tdrmeas/splitpair.html (and related graphics).

(List continued on next page.)

Primary Examiner—Steven Nguyen
(74) Attorney, Agent, or Firm—Cesari and McKenna, LLP

(57) ABSTRACT

A device and method for network communications and diagnostics are provided. One embodiment of the device includes a processor for generating a time-domain reflectometry testing stimulus signal when the device is operating in a network diagnostic mode. The testing signal is supplied to the network to cause the network to generate a reflection signal thereof from which presence and characteristics of a fault condition in the network may be determined.

30 Claims, 4 Drawing Sheets

OTHER PUBLICATIONS

Tektronix, Inc., "Measurement: 5. Locating Bridged Taps with the Tektronix TS100," pp. 1–2, http://www.tek.com/Me . . . Notes/ts100–tdrmeas/bridgetop.thml (and related graphics).

Tektronix, Inc., "Measurement: 6. Locating Water with the Tektronix TS100," p. 1, http://www.tek.com/Me . . . App_Notes/ts100–tdrmeas/water.html (and related graphics).

Tektronix, Inc., "Measurement: 7. Locating Intermittent Faults with the Tektronix TS100," pp. 1–2, http://www.tek.com/Me . . . App_Notes/ts100–tdrmeas/fault.html (and related graphics).

Tektronix, Inc., "Measurement: 8. TDR Measurement Range in Telephony Applications," pp. 1–2, http://www.tek.com/Me . . . Notes/ts100–tdrmeas/measrange.html.

Tektronix, Inc., "Measurement: 9. Finding an Unknown Velocity of Propagation," pp. 1–2, http://www.tek.com/Me . . . _Notes/ts100–tdrmeas/velocity.html (and related graphics).

Tektronix, Inc., "Measurement: 10. An Application Example: Upgrading Your Cable System for ISDN Using a TDR," pp. 1–3, http://www.tek.com/M . . . /App_Notes/ts100–tdrmeas/isdn.html (and related graphics).

Tektronix, Inc. "Measurement: 11. An Application Example: Upgrading Your Cable System for ADSL Using a TDR,"pp. 1–4, http://www.tek.com/M . . . App_Notes/ts100–tdrmeas/adsl.html (and related graphics).Notes/ts100–tdrmeas.adsl.html (and related graphics).

Tektronix, Inc., "Measurement: Glossary," pp. 1–3, http://www.tek.com/M . . . _Notes/ts100–tdrmeas/glossary.html.

Taylor, Kieran; "Analog and ISDN Access Is in the Cards"; Nov., 1995.

* cited by examiner

DEVICE AND METHOD FOR NETWORK COMMUNICATIONS AND DIAGNOSTICS

BACKGROUND OF THE INVENTION

1. Field of the Invention

The present invention relates generally to network communications and diagnostics, and more specifically, to network communications and diagnostics wherein a network communications medium is tested for faults that may affect the ability of the medium to transmit data between the network devices connected to it. Particular utility for the present invention is found in the area of computer networks utilizing Digital Subscriber Line (DSL) modem-based connections, although other utilities are also contemplated for the present invention, including other communications and computer networking applications.

2. Brief Description of Related Prior Art

A Modulator-Demodulator ("modem") is a communication device that permits communications between networked devices. More specifically, a modem (1) encodes, transforms, and organizes ("modulates") digital data supplied from a sending digital device (e.g., one or more digital computer systems) into a form suitable for transmission (e.g., frames of analog signals from which the data may be recovered and which includes appropriate frame checksums and other information) over a network communications medium (e.g., lines of a public switched telephone network, cable system, or other type of communications link), (2) transmits the frames via the medium, and (3) receives and transforms ("demodulates") modulated frames (i.e., sent from another modem) so as to recover from the received frames the original digital data from which the received frames were generated, which recovered digital data is provided for further processing to a receiving digital device. Additionally, modems typically also perform a variety of communications control functions (e.g., initiating and coordinating the data exchange, negotiating data transfer rate with the other modem involved in the data transfer, etc.).

Many different types of modems are available, and the characteristics of modems vary depending upon their data transmission rates, modes of use (e.g., for serial or parallel transmission, synchronous or asynchronous transmission, simplex, duplex, or full-duplex operation, etc.), modulation/demodulation/compression techniques, error correction technologies, nature of their modulated signals (e.g., digital or analog), etc. Additionally, some conventional modems (e.g., modems which utilize certain Rate Adaptive Digital Subscriber Line (RADSL) technology, such as Discrete Multi-Tone (DMT) technology) include hardware and software for determining the quality of the medium (i.e., ability of the medium to support modulated data transmissions between the sending and receiving modems, without exceeding a predetermined data exchange error rate threshold, in given communications channels and/or at given transmission rates). Based upon the quality of the data exchange medium, these RADSL modems negotiate their modulated data transmission bandwidth(s) and/or specific communications signal band(s)/channel(s) so as to minimize loss/corruption of data transmitted between the devices.

More specifically, one conventional technique used by certain RADSL modems to adjust their data exchange channel(s) and/or transmission rate(s) based upon the quality of the connection medium, consists of exchanging between the two modems via the medium, predetermined patterns of modulated test data signals at different transmission rates and/or in different signal band(s), determining the respective error rates of such transmissions, determining therefrom the best channel(s) and transmission rate(s) for data exchange that can be supported by the medium connecting the RADSL modems (i.e., the channel(s) that can reliably (i.e., without exceeding the predetermined error rate threshold) support the highest transmission rate(s)), and negotiating based upon these best channel(s) and rate(s) the data communications transmission rate(s) and channel(s) that will be used by the modems in the current session.

Thus, conventional modems can determine if a network communications medium is unable to support reliable data communications at the modems' maximum communications rates. It would be desirable, however, to provide a modem that is able to determine the nature and location of specific fault conditions in the medium that may be responsible for the medium's reduced data transmission quality. That is, it would be desirable to provide a modem that includes integrated capability both to classify and locate the whereabouts in the medium of specific physical characteristics/phenomena that may be responsible for reducing the medium's data transmission quality. Disadvantageously, without such modem capability in order to determine whether reduced transmission quality can be ameliorated (e.g., by physical repair of the medium), human operator intervention is required to determine the nature and location of the specific fault conditions (if any) in the medium that result in the medium's reduced transmission quality. Typically, such intervention involves time consuming visual inspection and/or testing of the medium using complex and expensive standalone test equipment.

SUMMARY OF THE INVENTION

In accordance with one aspect of the present invention, a communication device is provided that includes integrated diagnostic capabilities that permit the device to determine whether a fault condition exists in a communications network to which it is connected. The device includes a processor for generating a diagnostic testing pulse signal that is supplied to the network via the network communications medium to cause the medium to generate a reflection signal from the diagnostic signal. The reflection signal is indicative of whether a fault condition exists in the medium, and may be used by the device to determine the location of the fault condition in the network.

In one preferred embodiment of the invention, the testing signal is a time-domain reflectometry (TDR) stimulus pulse, and the reflection signal is a TDR reflection signal. In this embodiment, the device may use conventional TDR techniques to determine from characteristics of the testing and reflection signals, and the elapsed time from issuance of the testing signal to receipt by the device of the reflection signal, the location of fault conditions (if any) in the network. Such fault conditions may comprise, for example, an impedance discontinuity in the network communications medium. The device of this embodiment may also determine the possible classification of detected fault conditions.

Advantageously, the communications device of the present invention may quickly and efficiently determine the nature and location of specific fault conditions that may be present in the network communications medium. This fault information may be used, either alone or in combination with other diagnostics, to evaluate the medium's data transmission quality (and/or transmission quality at specific locations therein) to determine appropriate action needed to maintain reliable communications over the network.

These and other features and advantages of the present invention will become apparent as the following Detailed Description proceeds and upon reference to the Figures of the drawings, wherein like numerals depict like parts and in which:

Although the present invention will be described in connection with preferred embodiments and methods of use, many alternatives, modifications, and alternatives thereof will be apparent to those skilled in the art. Thus, it is not intended that the present invention be limited to these preferred embodiments and methods of use. Rather, it is intended that the present invention be viewed as being of broad scope encompassing all such alternatives, modifications, and variations as fall within the scope of the hereinafter appended claims.

DETAILED DESCRIPTION OF AN ILLUSTRATIVE EMBODIMENT

Figure 1:
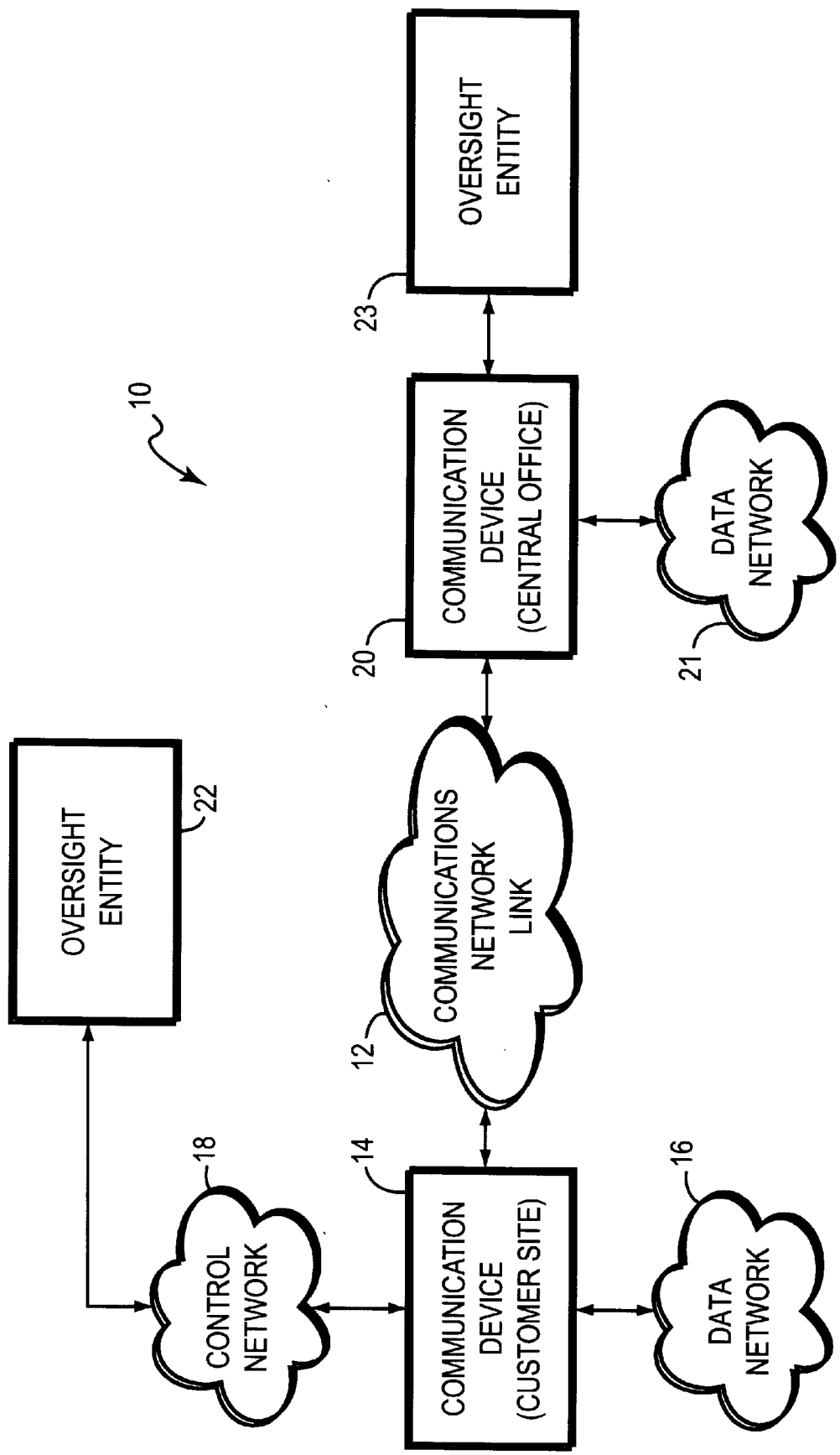
FIG. 1 is a highly schematic functional block diagram of a network system that may utilize the present invention.

FIG. 1 is a high-level functional block diagram of a network system 10 in which the present invention may be used. Network 10 is a wide area network that includes two ADSL modems 14, 20 that are coupled together via a conventional Plain-Old-Telephone System (POTS) communications link 12 comprised within a Public Switch Telephone Network (PSTN). Devices 14, 20 are each made according to one embodiment of the present invention. Device 14 may be located at a customer site, and device 20 may be located at a PSTN office switch remote from the customer site, but within the maximum "reach length" for the modems 14, 20. Although the following description will proceed based upon these exemplary locations for the devices 14, 20, it should be understood that these locations are merely for purposes of illustrating the operation of devices 14, 20 in network 10, and thus, should not be viewed as limiting the present invention.

Device 14 is coupled via a conventional control network 18 to an oversight entity 22 (e.g., a network computer system that controls and receives data related to operation of device 14 via network 18). Device 14 is also coupled to a packet-switched data network 16, from which device 14 receives data to be modulated for transmission via link 12 to the communication device 20. Device 14 modulates the data received from the network 16, and transmits same through the link 12, based upon data and commands device 14 receives from the entity 22 and from the sender of the data (e.g., a computer end-station, not shown) located in or connected to network 16. Device 14 also demodulates data signals received from network link 12, and transmits the demodulated data to the network 16 which then utilizes routing information (e.g., IP-based routing information) contained in the demodulated data to route the data to an intended recipient system (e.g., a computer endstation, not shown) in network 16.

Device 20 is coupled to its own respective oversight entity 23 (e.g., a network computer system that controls and receives data related to operation of device 20). Although the device 20 is shown in FIG. 1 as being directly connected to said entity 23, it should be understood that device 20 may be connected to the entity 23 via a control network (not shown). Likewise, although device 14 is shown in FIG. 1 as being coupled to the entity 22 via control network 18, if appropriately modified, device 14 may be directly coupled to such entity 22.

Device 20 is also coupled to a packet-switched data network 21, from which device 20 receives data to be modulated for transmission via network link 12 to the communication device 14. Device 20 modulates and transmits this data from the network 21 based upon data and commands device 20 receives from the entity 23 and from the sender of the data (e.g., a computer endstation, not shown) located in or connected to network 21. Entity 23 may comprise a PSTN control and auditing system. Likewise, device 20 also demodulates data signals received from network link 12, and transmits the demodulated data to the network 21, which then utilizes routing information (e.g., IP-based routing information) contained in the demodulated data to route the data to an intended recipient system (e.g., a computer endstation, not shown) in network 21.

Figure 2:
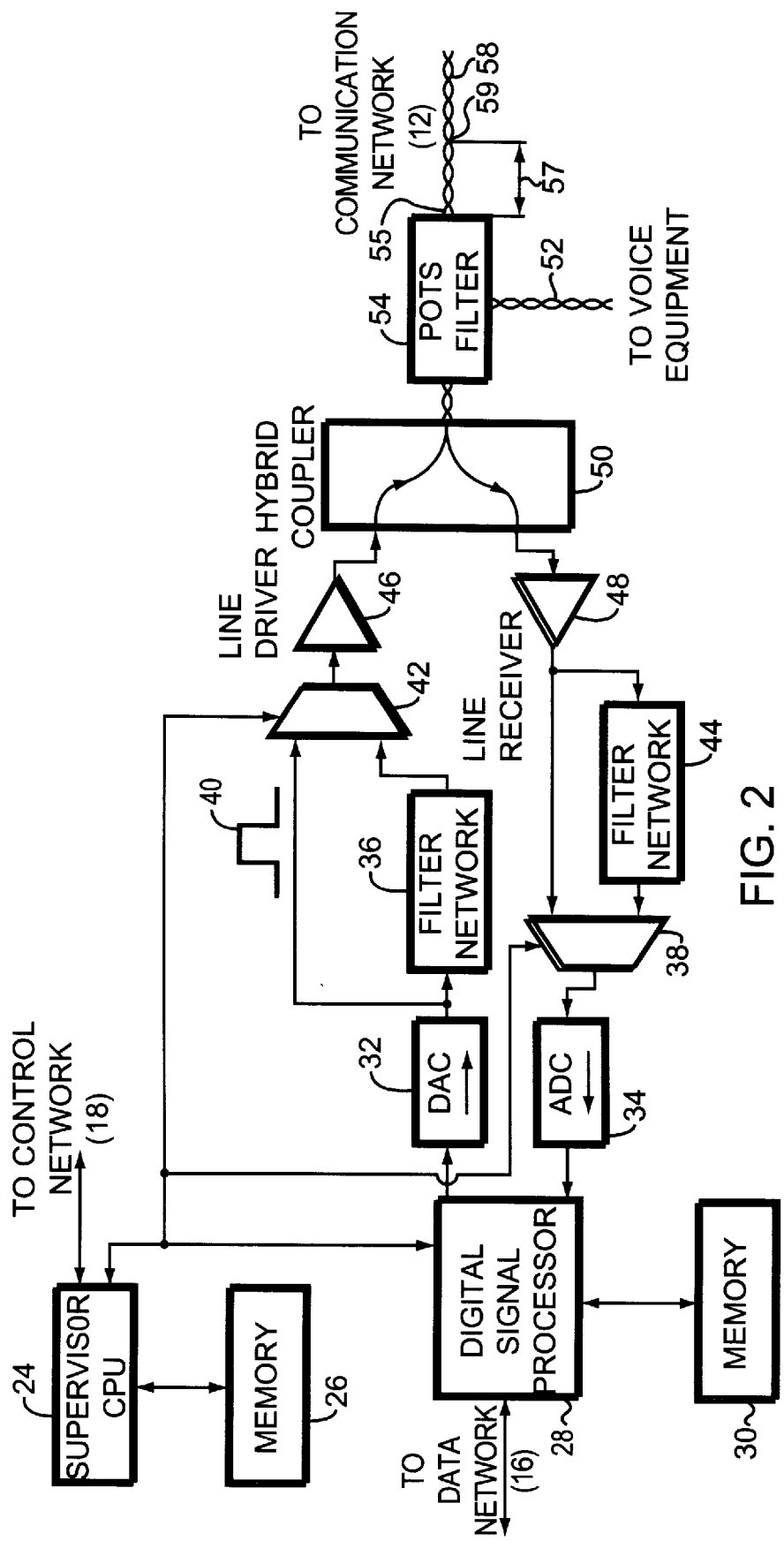
FIG. 2 is a highly schematic functional block diagram of one embodiment of the communication device of the present invention.

FIG. 2 is a highly schematic block diagram illustrating the construction of device 14 shown in FIG. 1. Device 14 comprises a digital signal processor 28 which is bidirectionally coupled to the network 16, supervisor central processor unit (SCPU) 24, and DSP memory (e.g., comprising either or both program instruction read only memory and/or random access memory) 30. DSP 28 also provides output signals to the input of digital-to-analog converter (DAC) 32, and receives as an input the output of analog-to-digital converter (ADC) 34.

SCPU 24 is bidirectionally coupled via network 18 to entity 22, and is also coupled to SCPU memory (e.g., comprising either or both program instruction read only memory and/or random access memory) 26. SCPU 24 also provides output signal selection commands to one-of-two signal multiplexers 38, 42.

In addition to having an input connected to DSP 28, the output of the DAC 32 is also connected in parallel to the input of filter network 36, and to one signal input of multiplexer 42. The other signal input of multiplexer 42 is received from the filter network 36. The output of multiplexer 42 is provided as the input to line driver circuit 46, whose output is provided as an input to hybrid coupler 50. A bidirectional connection is made from coupler 50 using a POTS connection line to a POTS filter system 54. The filter 54 is also connected by another bi-directional POTS connection line to optional voice equipment (e.g., in the case of device 14, voice telephone console and headset, not shown, and in the case of device 20, the PSTN switch's voice band network processing system, also not shown). An additional bi-directional POTS connection is made from the filter 54 to the network communications medium 58, which is a conventional bi-directional POTS line via which the device 14 is connected through network 12 to the device 20.

In addition to having its output connected as an input to DSP 28, ADC 34 receives as an input the output signal of multiplexer 38, which in turn, receives its signal inputs from filter network 44 and line receiver circuit 48. The output of circuit 48 is connected in parallel to the inputs of network 44 and one of the signal inputs of multiplexer 38. The input of circuit 48 is connected to an output of coupler 50.

It should be understood that the construction of device 20 may be identical to that of device 14, except that in device 20, the connection from the SCPU 24 may be made directly to the entity 23 rather than to the network 18, the connection from the DSP 28 to the network 16 may instead be made to the network 21, and the components of the devices 14, 20 may be appropriately configured to permit them to communicate via the different conventional upstream and downstream communications bands/channels used in ADSL communications.

Figure 3:
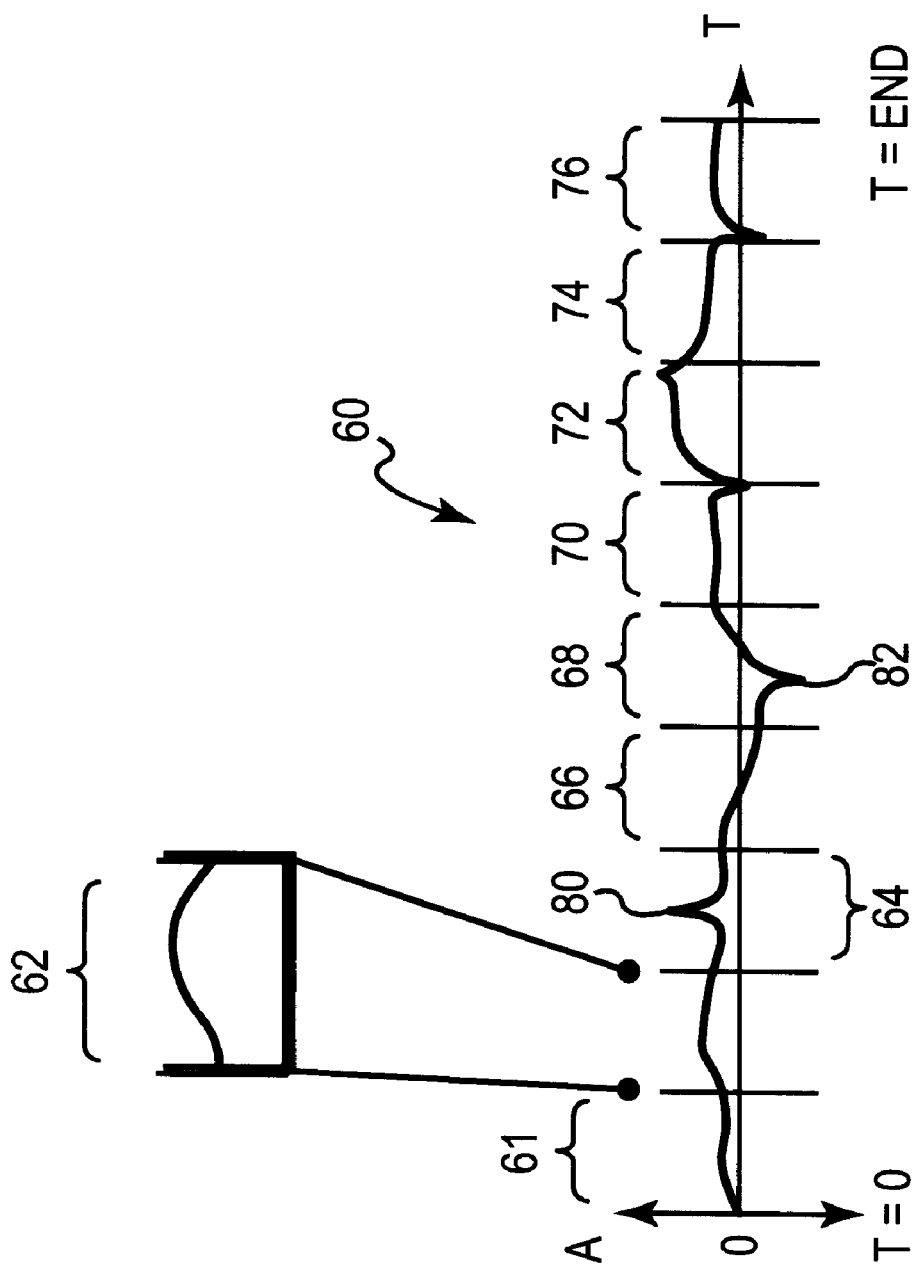
FIG. 3 is a graph of amplitude of reflection signals generated by the device of FIG. 2 versus time of receipt of said signals by said device.

With reference being made to FIGS. 1–3, the operation of the devices 14, 20 in system 10 will now be described. It should be understood that although the device 14 will be described as being the sending device (i.e., the device that is transmitting data through the network 12) and the device 20 will be described as being the receiving device (i.e., the device that is to receive the data sent by the sending device through the network 12), this is an arbitrary convention for purposes of illustrating the operation of these devices 14, 20, and in actual communications between devices 14, 20, the roles of these devices 14, 20 may either change periodically during the course of such communication (i.e., the device that is initially the sending device will become the receiving device, and vice versa) and/or devices 14, 20 may transmit and receive data simultaneously via different channels.

The device 14 has two different modes of operation: a normal (communications) mode of operation wherein the device 14 exchanges data with the device 20 via link 12, and a diagnostic testing mode wherein the device 14 performs TDR testing of the network link 12. The mode of operation of the device 14 is selected by the SCPU 24 by providing appropriate mode selection signals to the DSP 28 and the multiplexers 38, 42.

After the two devices 14, 20 have initialized and established an active communication session via link 12, when the network 16 desires to communicate with the network 21, network 16 communicates this to the DSP 28, which in turn, accepts from the network 16 the data, in digital form, that network 16 desires to transmit to the network 21. This digital data is encoded and organized into frames by the DSP 28 for transmission via the network 12, and the frames are output by the DSP 28 to the DAC 32. The encoding and framing of the digital data by the DSP 28 is performed so as to produce a series of digital code signals which when processed by the DAC 32 produce modulated analog output signals from which the data provided to the DSP 28 from the network 16 may be recovered by device 20 by demodulating the signals. The signals are also in a frequency band or bands suitable for ADSL transmission via the network 12, and reception and processing by the device 20 (e.g., reflecting the communications transmission rate, channel, modulation scheme, etc. previously negotiated by the devices). These modulated analog ADSL frame signals output by the DAC 32 are then supplied, in parallel, to both the input of the filter network 36 and one of the two signal inputs of the multiplexer 42.

As stated above, the mode selection signals output by the SCPU 24 determine whether the device 14 is in either a normal communications mode of operation, or a diagnostic testing mode of operation. When the device 14 is in the normal mode of operation, the control signals output by the SCPU 24 cause the multiplexer 42 to select for output the signal being supplied to the multiplexer 42 from the filter 36. Filter 36 processes the output signal from the DAC 32 so as to remove from the signals being transmitted from the device 14 interference with the signals being received by device 14.

The output signal of the multiplexer 42 is then amplified by the line driver 46 and otherwise processed so as to make the signal suitable for transmission via the network medium 58 (e.g., by processing the output so as to provide a differential output signal supplied via a differential output connection of suitable impedance). The output of the driver circuit 46 is then supplied to an input of the coupler 50.

Hybrid coupler 50 is a directional coupler that is designed to transmit the output signal from the driver circuit 46 to the filter 54 while substantially preventing transmission of the signal to the line receiver circuit 48. The output signal from the coupler 50 is then processed by conventional POTS filter circuit 54.

POTS filter 54 splits the relatively lower-frequency voice band signals (e.g., including analog voice, ringing and control tones, etc.) from the relatively higher-frequency ADSL signals, and directs these signals such that the voice band signals are permitted to propagate to the medium 58 from the voice equipment, and from the medium to the voice equipment, but not to propagate to the coupler 50 from either the medium 58 or the voice equipment. Similarly, filter 54 permits ADSL signals to propagate to the medium 58 from the coupler 50, and from the medium 58 to the coupler, but not to propagate to the voice equipment. The output of the filter 54 is then supplied to the network communications medium 58 so as to be received by the device 20.

When the device 14 is in the communication mode of operation, modulated ADSL frame signals received by the device 14 from the device 20 via the network medium 58 are first processed by the filter 54, and then are transmitted by the coupler 50 to the input of the line receiver 48. Line receiver 48 amplifies the signal received from the coupler 50, and converts the amplified signals into form suitable for further processing by the device 14 (e.g., from differential signals into non-differential signals supplied by a connection of suitable impedance or may simply amplify, and isolate the received signal). The output of the line receiver 48 is then supplied as one of the two inputs of the multiplexer 38, and as the input to filter network 44. The filter network 44 processes the signals received from the receiver 48 so as to remove from the signals being received by the device 14 interference from the signals being transmitted from the device 14 and other noise sources.

In the communication mode of the operation of device 14, a control signal supplied by the SCPU 24 to the multiplexer 38 causes the multiplexer 38 to select for output to the ADC 34 the output signal from the filter network 44. ADC 34 then digitizes the output signal from the network 44 into a resulting data bit stream suitable for processing by DSP 28. DSP 28 decodes the bit stream using a decoding algorithm that recovers is from the digitized bit stream the original (i.e., unmodulated) data from network 21 from which the device 20 generated the modulated frame signals that were transmitted via network 12 to the device 14. This decoding algorithm is determined by the DSP 28 based upon the results of previous communications negotiation between the devices 14, 20. Once the demodulated data has been generated by the DSP 28, it is supplied to the network 16, which in turn, routes the data to its intended recipient (e.g., based upon IP routing information contained in the demodulated data).

The process by which the devices 14, 20 initiate and establish an active communication session via link 12 will now be summarized. When device 14 initializes (i.e., powers up), it defaults into a communications mode of operation wherein the SCPU 24 transmits mode selection signals to the DSP 28, and multiplexers 38, 42 appropriate for the communications mode of operation of device 14. Thereafter, using conventional techniques, a communications session is established between the two devices 14, 20 wherein data is exchanged, in modulated form, between the devices 14, 20.

Data from network 16 that is to be sent to the network 21 may be processed by the device 14 in the aforedescribed manner and transmitted to the device 20. Device 20 may then process the received modulated signals from the device 14, demodulate them, and supply the recovered digital data to the network 21. Data exchanges may then take place so long as the communications session between the two devices 14, 20 is active.

If, during exchange of data between the devices 14, 20, it is desired to undertake diagnostic testing of the network 12 using device 14, the oversight entity 22 may initiate same by transmitting appropriate commands to the SCPU 24 of device 14 via the network 18. Alternatively, the SCPU 24 may initiate such testing based upon occurrence of a predetermined event (e.g., if the error rate in data exchange between the devices 14, 20 exceeds a predetermined threshold). In either case, when such testing is to be carried out, SCPU 24 changes the mode selection signal supplied to the DSP 28 so as to make the signal appropriate for the diagnostic testing mode of the device 14. However, the control signals supplied to the multiplexers 38, 42 by the SCPU 24 are not yet changed to reflect the change in operation mode of the device 14. Thus, the multiplexers 38, 42 continue to operate in the manner described above in connection with operation of the device 14 in the communications mode.

When the DSP 28 determines that the mode selection signal supplied from the SCPU 24 has changed to indicate that the device 14 is to enter the diagnostic mode from the communication mode, the DSP 28 generates appropriate digital signals for indicating to the other device 20 that communications with device 14 are to be temporarily suspended while the device 14 is operating in the diagnostic mode. These digital signals are then processed by the DAC 32, network 36, multiplexer 42, driver 46, coupler 50, and filter 54 of the device 14, and thereafter, are transmitted from the device 14 to the device 20 via the network 20. The DSP 28 also transmits signals to the network 16 to indicate that device 14 is entering the diagnostic mode and that communications using the device 14 will be temporarily suspended while the device 14 is in this mode.

Once the device 20 has demodulated these signals from the device 14, the DSP (not shown) of the device 20 forwards them to the SCPU of device 20 which determines therefrom that the device 14 wishes to temporarily suspend data exchange in order to enter test mode. The SCPU of the device 20 then informs the entity 23 of this change of status, and issues appropriate commands to the DSP of device 20 also to inform the network 21 thereof. The SCPU of the device 20 then commands the DSP of device 20 to suspend further data exchange with device 14 until device 14 informs the device 20 that device 14 has completed its testing of network 12 and is again ready to communicate with the device 20, and to transmit to the device 14 signals indicating acknowledgment of the suspension of data exchange between the devices 14, 20.

When the DSP 28 demodulates the acknowledgment signals from the device 20, the DSP 28 supplies them to the SCPU 24, which then changes the control signals being supplied to the multiplexers 38, 42 so as to be appropriate for the test mode. The SCPU 24 may also undertake such action if the device 14 does not receive the acknowledgment signals within a "time out" period, after repeated retransmission of the signals for indicating the device 20 that device 14 wishes to enter test mode. The device 14 then undertakes TDR testing of the medium 58 of the network 12 to determine whether fault conditions are present in the medium 58, the characteristics and types of any such fault conditions, and their locations in the network 12. The results of this testing may be supplied from the SCPU 24 to the entity 22 via the network 18 whereby to permit the entity to request that further action be undertaken based upon this information (e.g., dispatch of human personnel to correct the fault conditions determined to be present in the medium 58).

Device 14 begins TDR testing of the network 12 by generating a digital code that is converted by the DAC 32 into a TDR stimulus pulse 40. Pulse 40 preferably is a rectangular pulse, and has empirically determined pulse width, amplitude, and edge rate that permit meaningful results to be obtained from the TDR testing. The mode selection signal supplied to the multiplexer 42 by the SCPU 24 at this time in the testing sequence causes the multiplexer 42 to select for output the signal input directly from the output of the DAC 32. This output from the DAC 32 is thus supplied via the multiplexer 42 to the line driver 46, and thence, to the medium 58 via the coupler 50 and filter 54. Advantageously, by utilizing the multiplexer 42 in the foregoing manner (i.e., so as to supply the output of the DAC 32 to the line driver 46 without first processing the output by propagating it through the network 36), less distortion is applied to the signal 40 than would be applied if the signal 40 were to be processed by network 36. This improves the accuracy of the TDR testing.

Changes in characteristic impedance in the line 58 encountered by the signal 40 as it propagates through line 58, generate reflections or echoes (collectively referred to by numeral 60) that are transmitted back to the device 14. These reflection signals are processed by the filter 54, coupler 50, and receiver 48. In the diagnostic mode, the mode selection signal supplied to the multiplexer 38 causes the multiplexer 38 to select for output the signal that is supplied directly from the line receiver 48. The output from the multiplexer 38 is then processed by the ADC 34 (i.e., sampled and held to digitize same) and these digital signals (representative of the amplitudes of the reflection received by device 14 from the medium 58) are supplied to the DSP 28. The signals that are supplied to the ADC 34 in the test mode of device 14 are not processed by the filter 44. Advantageously, by utilizing the multiplexer 38 in the foregoing manner (i.e., so as to input to the ADC 34 the signals directly from the receiver 48), less distortion is applied to the reflection signals that are digitized than would be applied if the signals 60 were to be processed by network 44. This improves the accuracy of the TDR testing.

As the digitized echo signals are received by the DSP 28, they are stored in memory 30 by the DSP 28, along with respective time stamps indicating the respective elapsed times between their receipt by the DSP 28 and the transmission from the DSP 28 of the digital codes for generating the pulse 40 (collectively referred to hereinafter as "reflection data"). The DSP 28 may store the reflection data received over a predetermined time period (e.g., the twice the length of time believed necessary for the pulse 40 to traverse the connection link 12 to the modem 20, or twice the length of time that the pulse 40 would take to traverse the maximum modem reach length desirable for line 12 given the ADSL communication technique being used, which is represented as the time period from T=0 to T=END in FIG. 3). Once the predetermined time period has elapsed, the total record of reflection data stored in memory 30 is transferred by the DSP 28 to the SCPU 24, which stores the data in memory 26.

As shown in FIG. 3, depending upon the size of memory 30, a "sliding window" approach to processing the reflection data may be used by the DSP 28 and SCPU 24. That is, the total predetermined time period (i.e., from T=0 to T=END in FIG. 3) may be divided into discrete time intervals 61, 62, 64, 66, . . . 76 within which the respective amounts of reflection data received by the DSP 28 are equal to the maximum portion of memory 30 that is available for storage of reflection data. When the reflection data of a given time interval completely fills the storage available therefor in memory 30, the DSP 28 stops storing reflection data, and the reflection data that is currently stored in the memory 30 is transmitted to SCPU 24, which then stores that data, together with a notation of the time interval in which it was generated, in the memory 26. The DSP 28 then may wait until the echo signals being received have substantially ceased, at which time the DSP 28 may cause another pulse 40 to be supplied to the medium 58. Thereafter, prior to again storing received reflection data, the DSP 28 may wait for the period time sufficient to begin receiving the reflection data from the next time interval after the last time interval whose reflection data was stored in the memory 30, at which time the DSP 28 may store the reflection data from said next time interval in memory 30. After the DSP 28 has received and stored the reflection data from the next time interval in the memory 30, the DSP 28 may transfer that data to the SCPU 24, which then stores that data, together with a notation of the time interval in which it was generated, in the memory 26. This sliding window storage process may be repeated until the reflection data from all of the discrete time intervals is stored in the memory 26, at which time, the SCPU 24 may reconstruct a total record of reflection signals that would have been generated using the aforedescribed method wherein all of the reflection signals are generated from a single pulse 40. The SCPU 24 may then store this reconstructed total record in the memory 26.

Either of the above processes for generating the total record may then be repeated a predetermined number of times to produce several such total records, which may then be averaged together by the SCPU 24 to produce a composite or average total record. The average total record may then be stored by the SCPU 24 in memory 26. This average total record may then be used to determine whether fault conditions are present in the line 58, and the characteristics and locations of any fault conditions determined to be present. It should be understood that although in the following description the SCPU 24 is described as carrying out the processing to determine from the average total record whether fault conditions are present in the line 58, and the characteristics and locations of the fault conditions determined to be present in line 58, if appropriately modified, DSP 28 could instead carry out this processing.

As will be understood by those skilled in TDR techniques, the absolute values of the amplitudes of the reflection signals in the average total record, in essence, provide relative measurements of characteristic impedances along line 58 (i.e., at locations in the line 58 where reflection signals were generated and processed by the DSP 28). In device 14, the actual characteristic impedance of terminal portion 59 and its distance 57 from the termination 55 are empirically determined and stored in memory 26. The amplitude of the pulse 40 and the propagation velocities of signals 40, 60 through the medium 58, are also stored in the memory 26. Based upon this information, using conventional TDR techniques and algorithms well know to those skilled in the are, the SCPU 24 converts the elapsed times between the transmission of the pulse 50 and receipt of respective reflection signals 60 by the device 14 in the average total record into respective locations in line 58 at which the respective reflection signals were generated, and calculates from the amplitudes of the reflection signals respective actual characteristic impedances at these locations in line 58.

Memory 26 may store predetermined characteristic impedances and thresholds that have been found empirically to be associated with presence of respective fault conditions (e.g., relatively high impedance and low impedance locations in the line 58, referred to hereinafter or "open" and "short" circuits, respectively). These predetermined characteristic impedances and thresholds may be stored in memory 26 in association with classifications (i.e., names and characteristics) of the respective fault conditions with which they are associated. Based upon comparison of the actual characteristic impedances in line 58 to these predetermined characteristic impedances and/or thresholds, the SCPU 24 may determine whether any of the fault conditions whose characteristic impedances and/or thresholds is stored in memory 26 is present in line 58, and if so, may also determine from the information stored in memory 26, the classifications of any such detected fault conditions.

Alternatively, SCPU 24 may determine presence of potential fault conditions in line 58 by determining whether any of the actual characteristic impedances in line 58 are outside of a normal threshold range (e.g., ±10 percent of nominal characteristic impedance of line 58) that has been determined empirically to be indicative of normal conditions in line 58 (i.e., actual impedances outside of the range are likely to be indicative of fault conditions in the line 58). The locations of any such potential fault conditions may be then determined by the locations of the actual characteristic impedances from which they were determined to exist.

The SCPU 24 may also determine (e.g., using conventional techniques for determining maxima and minima) locations in line 58 where the amplitudes of the generated reflection signals vary significantly (e.g., by more than 10 percent) from the mean amplitude of reflection signals processed by the DSP 28. Such amplitudes are collectively referred to by numerals 80, 82 in FIG. 3, and may indicate large impedance discontinuities in line 58 (i.e., large variations from the nominal characteristic impedance of the line 58), which may constitute fault conditions in themselves or may be indicative of other types of fault conditions (e.g., open or short circuits).

Additionally, the SCPU 24 may retrieve from memory 26 a previously generated average total record (e.g., generated when the device 14 was initially installed), and the SCPU 24 may compare the previously generated average total record to the most recently generated average total record to determine those locations in the line 58 where the reflection signals generated in the most recent testing do not match those previously generated, plus or minus an empirically determined error threshold indicative of fault conditions that may have been generated in the line 58 as a result of aging of the line 58 (i.e., during the time period from generation of the previous record to the present).

Data pattern recognition and statistical (e.g., "curve fitting") analysis techniques may also be used by SCPU 24 to determine presence and classifications of fault conditions in the medium 58. That is, reflection data patterns indicative of respective fault conditions (e.g., open and short circuits, etc.) that may be present in line 58 may be generated by previous empirical testing and stored in association with the respective classifications of such fault conditions, in memory 26, and SCPU 24 may compare the previously stored reflection data patterns with the most recently generated average total record to determine therefrom, using conventional data pattern recognition and statistical analysis techniques, locations and classifications of any such fault conditions in line 58.

For purposes of this TDR testing, propagation delays of the reflection signals from the termination of device 14 to the DSP 28 through filter 54, coupler 50, receiver 48, multiplexer 38, and ADC 34, and the propagation delays of the stimulus signal 40 from the DSP 28 through DAC 32, multiplexer 42, line driver 46, coupler 50, and filter 54, may be empirically determined and preprogrammed into the SCPU 24 and/or DSP 28. These delays may be used by the SCPU 24 and/or DSP 28 to calculate the actual times of transmission from the device 14 of the signal 40 and receipt by the device 14 of the signals 60, so as to more accurately calculate the elapsed time between transmission of signal 40 from and the receipt of signals 60 by device 14.

Using some or all of the above techniques, the SCPU 24 may determine the classifications and locations of fault conditions in line 58. The SCPU 24 may then report same to the oversight entity 22 via control network 18. Alternatively, or in addition to this, the SCPU 24 may provide the entity 22 with all of the reflection data (or portions thereof) for storage, verification of the fault conditions, locations, etc. determined by the SCPU 24 to be present in the line 12, and/or for other processing (e.g., historical trend analysis, etc.) at entity 22.

Once the TDR testing is complete and the results of such testing (i.e., the types of detected fault conditions, their locations, and characteristics) have been provided to the entity 22 by the device 14, the entity 22 transmits control signals to the SCPU 24 via the network 18 that cause the SCPU 24 to change the mode selection signals supplied to the DSP 28 and multiplexers 38, 42 so as to be appropriate for the normal (i.e., communications) mode of operation. The DSP 28 then indicates this change of operational status to the network 16, and to the device 20 via the network 12, and the two devices 14, 20 then may resume data exchanges in the above manner (after renegotiating their transmission rates, etc., if necessary). The entity 22 may use the TDR test results communicated to it by the device 14 to inform human repair personnel of such faults, their characteristics, and locations, so as to permit the personnel to repair the faults.

In device 14, the SCPU 24 may comprise 68EN360, MPC860, or MPC850 microcontroller integrated circuit chips of the type manufactured by Motorola, Inc. of Sunnyvale, Calif., appropriately programmed for carrying out the aforesaid operations for SCPU 24. Also, the line driver 46, line receiver 48, and DSP 28 (if appropriately programmed) may comprise integrated circuit chips of the type manufactured by Analog Devices, Inc. of Norwood, Mass.

Thus, it is evident that there have been provided, in accordance with the present invention, a network communications and diagnostics device and method that fully satisfy the aims and objectives, and achieve the advantages, set forth above. As will be apparent to those skilled in the art, many alternatives, modifications, and variations of the embodiments described above are possible. For example, if appropriately modified, TDR testing of the network medium may be used as part of a battery of tests comprising conventional medium testing procedures (e.g., of the types used in the RADSL and/or full-bandwidth bit error-rate techniques). The SCPU 24 may toggle the processor operation mode selected by the selection signal so as to temporarily interrupt communication (i.e., data exchange) between the devices 14, 20, perform and the battery of tests, and then resume communication between the devices after the battery is complete. The procedures for carrying out this battery of tests, and for evaluating the results thereof, may be programmed into the modem devices 14, 20 or the oversight entity. By utilizing such a battery of tests, the medium's data transmission quality may be better evaluated than is possible using only one testing procedure (e.g., by generating a weighted average of the results obtained by the various tests via an empirically determined weighting function). Advantageously, this permits adjustment in transmission channels and/or bandwidths to be based upon the results of the battery of tests, which is likely to be more accurate than is possible from results of only a single such testing technique.

Figure 4:
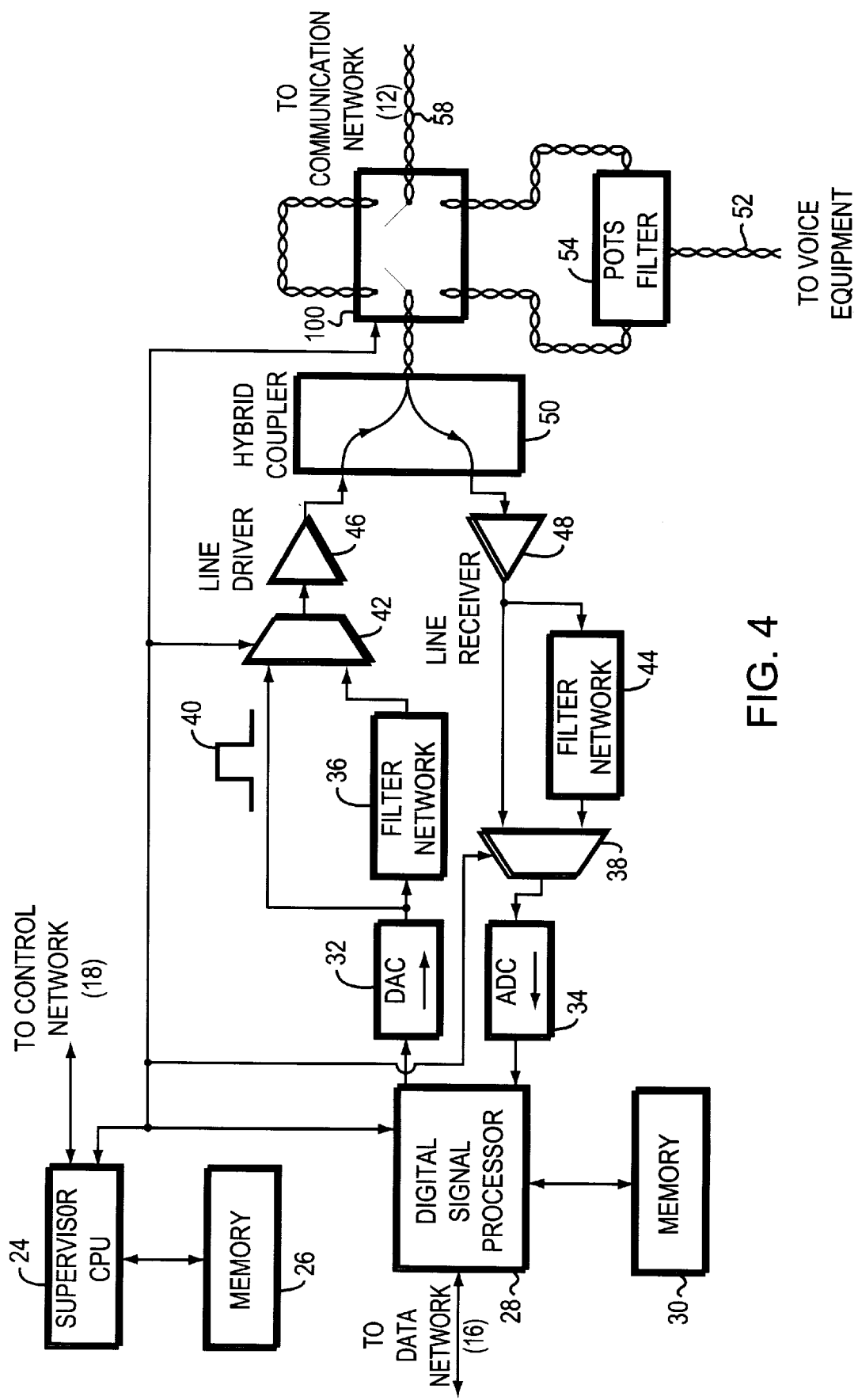
FIG. 4 is a highly schematic functional block diagram of a variation of the embodiment of FIG. 2.

Additionally, as shown in FIG. 4, each of the devices 14, 20 may also include a switch 100 that is controlled by SCPU 24 so as to permit the signal 40 to be transmitted to the medium 58 without having to propagate through the network 54, and to permit the reflection signals to be received by the coupler 50 without having to propagate through is the filter 54. Advantageously, use of such a switch 100 in device 14 further reduces distortions of signal 40 supplied to the network medium 58 and of reflection signals 60 processed by the DSP 28, thereby improving the accuracy of the TDR testing carried out by the device 14.

In a yet further modification, the device 20 may be adapted such that when it receives the test initiation signal from the device 14 (i.e., indicating that TDR testing is about to begin), device 20 may cease communications and disconnect itself from the medium 58 for a predetermined time period sufficient for the device 14 to carry out its TDR testing, to thereby provide an open circuit which generates a clear echo signal in response to the TDR stimulus 40. Advantageously, this modification may permit measurement of the connection distance between the devices 14, 20, and may permit more accurate determination of whether all of the potential faults in the communication path 12 between the two devices 14, 20 have been located by TDR testing.

Additionally, although the modem 20 at the local PSTN switch is shown as being connected to a single other modem 14 via link 12, modem 20 may include conventional circuitry for implementing a Digital Subscriber Line Access Multiplexing (DSLAM) technique for permitting the modem 20 to receive and process ADSL traffic from multiple connections of which connection 12 may be only one. Also, the data network 21 may comprise an Asynchronous Transfer Mode (ATM) network utilizing high-speed transmission media such as E3, SONET, and/or T3, and the modulated data packets exchanged between the modems 14, 20 may contain routing information suitable for permitting the packets to be routed in the ATM network. The network 16 may comprise a Local Area network (LAN) having appropriate hardware and software for permitting the modem 14 to be shared among multiple processes of the LAN.

Further, the programming instruction code for causing the SCPU 24 and the DSP 28 to carry out some or all of the aforedescribed operations may be stored in internal ROM comprised in the SCPU 24 and DSP 28 themselves, and/or may be stored in computer-readable memories 26, 30, respectively. Additionally, although the modems 14, 20 have been described as being ADSL modems, if appropriately modified in ways apparent to those skilled in the art, they may instead be adapted for communication via ISDN or other protocols.

Also, although each of devices 14, 20 has been described as being of substantially the same construction, in order to minimize cost to the customer at the customer site, the device 14 may comprise a modem lacking abilities to perform TDR testing, and all such TDR testing may be performed by the device 20. Likewise, the oversight entity 22 and network 18 may be eliminated, and all oversight functions may be performed by the entity 23. Additionally, control signals from entity 23 may be transmitted to modem 14 via device 20 and link 12.

Additionally, the modem 14 may be comprised in a printed circuit card for use in a personal computer system. The printed circuit card may be a Network Interface Card.

Other modifications are also possible. Accordingly, it is intended that the present invention be viewed as broadly encompassing all such alternatives, modifications, and variations, as may be included in the spirit and scope of the hereinafter appended claims.

What is claimed is:

1. A communication device comprising:

a processor for generating one of a communication signal and diagnostic testing signal depending upon whether said device is operating in one of a communication mode and a diagnostic mode, respectively, and wherein said diagnostic signal is for being supplied to a network to cause said network to generate a reflection signal from said diagnostic signal to permit said device to determine whether a fault condition exists in said network;

within said device, a first path having a filter, and a second path not having said filter; and, a switch for permitting said diagnostic and reflection signals to bypass said filter when said device is in said diagnostic mode.

2. A device according to claim 1, further comprising:

said network has a communications medium (hereinafter medium), and said processor is a digital signal processor (DSP).

3. A device according to claim 2, further comprising:

said first path connecting the DSP to the medium when the device is in the communication mode of operation, and said second path connecting the DSP to the medium when the device is in the diagnostic mode of operation.

4. A device according to claim 3, further comprising:

the first path includes two filter networks, one of said filter networks being connected between a digital-to-analog converter and a line driver, and the other of said filter networks being connected between said medium and said line driver, said filter being in one of said filter networks.

5. A device according to claim 3, further comprising:

the second path is for transmitting the diagnostic signal from the DSP to the medium when the device is in the diagnostic mode of operation, and also wherein transmission of said diagnostic signal through the second path to said medium imparts less distortion to said diagnostic signal than would be imparted to said diagnostic signal if said diagnostic signal were to be transmitted to said medium through said first path.

6. A device according to claim 3, further comprising:

the second path is for transmitting the reflection signal from the medium to the DSP when the device is in the diagnostic mode of operation, and also wherein transmission of the reflection signal from the medium through the second path to the DSP imparts less distortion to said reflection signal than would result if said reflection signal were to be transmitted to said DSP through said first path.

7. A device according to claim 1, further comprising:

a controller for selecting the mode of operation of the device.

8. A device according to claim 7, further comprising:

one of said controller and said processor is for determining at least one characteristic of said fault condition.

9. A device according to claim 8, further comprising:

said one of said controller and said processor is also for determining, based at least partially upon time between supply of said diagnostic signal and receipt of said reflection signal by said processor a location of said fault condition in said network.

10. A method of using a communication device coupled to a network communication medium (hereinafter medium), the method comprising the steps of:

a. in a communications mode of operation of said device, using said device to communicate via said medium;

b. in a test mode of operation of said device, using said device to perform a time-domain reflectometry test of said medium, said test performed by transmitting a diagnostic signal over said medium and receiving a reflection signal from said medium in response to said diagnostic signal;

c. switching during said communications mode, communication signals into a first path having a filter; and, d. switching during said test mode said diagnostic and reflection signals into a second path not having said filter.

11. A method according to claim 10, further comprising:

switching between said communications mode and said test mode of operation.

12. A method according to claim 10, further comprising:

automatically switching between said communications and said test mode of operation based upon a signal supplied to said device from a source external to said device.

13. The method according to claim 10, further comprising:

executing, in a processor, a computer program having instructions; and, causing, in response to said instructions, said processor to generate one of a communication signal and said diagnostic signal depending upon whether said processor is operating in said communication mode or said diagnostic mode, respectively, said modes being selected based upon a mode selection signal supplied to said processor, said diagnostic signal being supplied to said medium to cause said medium to generate said reflection signal in response thereto, said reflection signal characteristic of the condition, if a fault condition exists in said medium.

14. The method according to claim 13, further comprising:

determining a nature of said fault condition in response to said instructions.

15. The method according to claim 14, further comprising:

permitting data communication to travel on medium between said communication device and a second device, and said fault condition has an impedance discontinuity in said medium.

16. The method according to claim 10, further comprising:

using said diagnostic signal as a time-domain reflectometry stimulus signal, and said reflection signal is a time-domain reflectometry reflection of said stimulus signal.

17. A method of using a first communication device, said first communication device being coupled to a second communication device via a network, the method comprising the steps of:

a. exchanging data with said second device via said network;
b. temporarily interrupting exchange of data with said second device via said network;
c. during temporary interruption or said exchange, performing a time-domain reflectometry test of said network using said first communication device, said test performed by transmitting a diagnostic signal over said network and receiving a reflection signal from said network in response to said diagnostic signal;
d. resuming said exchange after completion of said test,
e. switching within said first device during a communication mode, communication signals into a first path having a filter; and,
f. switching within said first device during said time domain reflectometry test, said diagnostic and reflection signals into a second path not having said filter.

18. A method according to claim 17, further comprising:

emitting from said first communication device said diagnostic signal as a time-domain reflectometry stimulus signal.

19. A method according to claim 17, further comprising:

receiving at said first communication device said reflection signal from said network, said reflection signal being generated in response to a time-domain reflectometry stimulus signal.

20. A communication device, comprising:

a processor for generating one of a communication signal and a diagnostic testing signal depending upon a mode of operation, said diagnostic signal being for testing a network to cause said network to generate a reflection signal from which presence of a fault condition in said network may be detected;
within said device, a first path having a filter, and a second path not having said filter; and,
a switch for permitting said diagnostic testing signal and said reflection signal to by-pass said filter when said device is in a diagnostic mode of said mode.

21. A system according to claim 20, further comprising:

means for determining remotely from said processor whether said fault condition exists based upon said reflection signal.

22. A system according to claim 20, further comprising:

a plurality of different processors for determining, based upon said reflection signal, whether said fault condition exists in said network.

23. A communications device having integrated diagnostic capabilities, comprising:

a processor for generating a plurality of diagnostic testing signals over a time interval and for supplying said signals to a network to cause said network to generate reflection signals associated with respective ones of said testing signals, and computer-readable memory for storing said reflection signals in association with said respective ones of said testing signals and respective times of generation and receipt by said processor of said testing signals and said reflection signals, respectively;
within said device, a first path having a filter, and a second path not having said filter; and,
a switch for permitting said diagnostic and reflection signals to bypass said filter when said device is in said diagnostic mode
means for determining whether a fault condition exists in said network based upon comparison between reflection signals associated with different respective testing signals.

24. A communications device according to claim 23, further comprising:

said time interval begins at an initial installation of said device.

25. A communications device according to claim 24, further comprising:

said time interval ends at a testing of said network that is subsequent to an initial testing of said network at said installation.

26. A communication device comprising:

a processor for generating one of a communication signal and diagnostic testing signal depending upon whether said device is operating in one of a communication mode and a diagnostic mode, respectively, and wherein said diagnostic signal is for being supplied to a network to cause said network to generate a reflection signal from said diagnostic signal to permit said device to determine whether a fault condition exists in said network;
a digital signal processor (DSP) and a plurality of signal processing paths between said network and said DSP;
a first path of said plurality of signal processing paths for connecting the DSP to the network when the device is in the communication mode of operation, and a second path of said plurality of signal processing paths for connecting the DSP to the network when the device is in the diagnostic mode of operation;
the first path includes two filter networks, one of said filter networks being connected between a digital-to-analog converter and a line driver, and the other of said two filter networks being connected between said network and said line driver, and,
a switch for permitting said diagnostic and reflection signals to bypass said other filter network when said device is in said diagnostic mode.

27. A computer readable media, comprising:

said computer readable media having instructions written thereon for execution in a processor for the practice of the following steps for use of a communication device,
a. in a communications mode of operation of said device, using said device to communicate via a network communication medium (hereinafter medium);
b. in a test mode of operation of said device, using said device to perform a time-domain reflectometry test of said medium, said test performed by transmitting a diagnostic signal over said medium and receiving a reflection signal from said medium in response to said diagnostic signal;
c. switching during said communications mode, communication signals into a first path having a filter; and d. switching during said test mode said diagnostic and reflection signals into a second path not having said filter.

28. Electromagnetic signals propagating on a computer network, comprising:

said electromagnetic signals carrying information having instructions for execution in a processor for the practice of the following steps for use of a communication device,
 a. in a communications mode of operation of said device, using said device to communicate via a network communication medium (hereinafter medium);
 b. in a test mode of operation of said device, using said device to perform a time-domain reflectometry test of said medium, said test performed by transmitting a diagnostic signal over said medium and receiving a reflection signal from said medium in response to said diagnostic signal;
 c. switching during said communications mode, communication signals into a first path having a filter; and
 d. switching during said test mode said diagnostic and reflection signals into a second path not having said filter.

29. A computer readable media, comprising:

said computer readable media having instructions written thereon for execution in a processor for the practice of a method, the method for using a first communication device, said first communication device being coupled to a second communication device via a network, the method having the steps,
 a. exchanging data with said second device via said network;
 b. temporarily interrupting exchange of data with said second device via said network;
 c. during temporary interruption of said exchange, performing a time-domain reflectometry test of said network using said first communication device, said test performed by transmitting a diagnostic signal over said network and receiving a reflection signal from said network in response to said diagnostic signal;
 d. resuming said exchange after completion of said test,
 e. switching within said first device during a communication mode, communication signals into a first path having a filter; and
 f. switching within said first device during said time domain reflectometry test, said diagnostic and reflection signals into a second path not having said filter.

30. Electromagnetic signals propagating on a computer network, comprising:

said electromagnetic signals carrying information having instructions for execution in a processor for the practice of a method, the method for using a first communication device, said first communication device being coupled to a second communication device via a network, tile method having the steps,
 a. exchanging data with said second device via said network;
 b. temporarily interrupting exchange of data with said second device via said network;
 c. during temporary interruption of said exchange, performing a time-domain reflectometry test of said network using said first communication device, said test performed by transmitting a diagnostic signal over said network and receiving a reflection signal from said network in response to said diagnostic signal;
 d. resuming said exchange after completion of said test,
 e. switching within said first device during a communication mode, communication signals into a first path having a filter; and
 f. switching within said first device during said time domain reflectometry test, said diagnostic and reflection signals into a second path not having said filter.

* * * * *